(12) United States Patent
Kokini et al.

(10) Patent No.: US 8,956,577 B2
(45) Date of Patent: Feb. 17, 2015

(54) MICROFLUIDIC DEVICE COMPRISING A BIODEGRADABLE MATERIAL AND METHOD OF MAKING SUCH A MICROFLUIDIC DEVICE

(75) Inventors: Jozef L. Kokini, Mahomet, IL (US);
Gang Logan Liu, Champaign, IL (US);
Austin Hsiao, Urbana, IL (US); Jarupat Luecha, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 209 days.

(21) Appl. No.: 13/524,551

(22) Filed: Jun. 15, 2012

(65) Prior Publication Data

US 2012/0321536 A1 Dec. 20, 2012

Related U.S. Application Data

(60) Provisional application No. 61/498,222, filed on Jun. 17, 2011.

(51) Int. Cl.
*B01L 99/00* (2010.01)
*B29C 65/48* (2006.01)
(Continued)

(52) U.S. Cl.
CPC ......... *B29C 65/4895* (2013.01); *B29C 65/8215* (2013.01); *B29C 66/1122* (2013.01); *B29C 66/53461* (2013.01); *B29C 66/73791* (2013.01); *B29C 66/7465* (2013.01); *C08J 5/122* (2013.01); *C09J 5/00* (2013.01); *B81C 1/00071* (2013.01); *B29C 65/528* (2013.01); *B01L 3/502707* (2013.01); *B29C 66/73771* (2013.01); *B29L 2031/756* (2013.01); *C08J 2389/00* (2013.01); *C09J 2400/143* (2013.01); *C09J 2489/006* (2013.01); *B29C 65/8207* (2013.01); *B29C 65/8253* (2013.01); *B81B 2201/058* (2013.01); *B81C 2201/019* (2013.01); *B01L 2300/12* (2013.01); *B01L 2300/126* (2013.01); *B29C 65/522* (2013.01)
USPC ........................................................ 422/503

(58) Field of Classification Search
CPC .................... B01L 2300/126; B29C 66/73791
USPC ................................................. 422/502, 503
See application file for complete search history.

(56) References Cited

U.S. PATENT DOCUMENTS 6,366,924 B1 * 4/2002 Parce ................................... 1/1
6,849,113 B2    2/2005 Padua et al. ................ 106/161.1
(Continued)

OTHER PUBLICATIONS

Bettinger, Christopher J. et al., "Silk Fibroin Microfluidic Devices," *Advanced Materials* 19 (2007) pp. 2847-2850.
(Continued)

*Primary Examiner* — Paul Hyun
(74) *Attorney, Agent, or Firm* — Brinks Gilson & Lione

(57) ABSTRACT

A microfluidic device comprising a biodegradable material comprises, according to one embodiment, a body including one or more channels extending therethrough for passage of a fluid, where the body includes a first preform and a second preform bonded to the first preform. The first preform comprises a biodegradable material derived from a plant and the second preform defines a wall of each of the channels. According to another embodiment, the microfluidic device comprises a body having one or more channels extending therethrough for passage of a fluid, where the body comprises a biodegradable material and is a monolithic body including no seams.

16 Claims, 5 Drawing Sheets

(51) Int. Cl.
| | |
|---|---|
| B29C 65/82 | (2006.01) |
| B29C 65/00 | (2006.01) |
| C08J 5/12 | (2006.01) |
| C09J 5/00 | (2006.01) |
| B81C 1/00 | (2006.01) |
| B29C 65/52 | (2006.01) |
| B01L 3/00 | (2006.01) |
| B29L 31/00 | (2006.01) |

(56) References Cited

U.S. PATENT DOCUMENTS

2008/0013092 A1* 1/2008 Maltezos et al. ............... 356/417
2009/0004737 A1* 1/2009 Borenstein et al. ............ 435/395

OTHER PUBLICATIONS

Domachuk, Peter et al., "Bio-Microfluidics: Biomaterials and Biomimetic Designs," *Advanced Materials* 22 (2010) pp. 249-260.

Dong, Jian, et al., "Basic Study of Corn Protein Zein, as a Biomaterial in Tissue Engineering, Surface Morphology and Biocompatibility," Biomaterials, 25, (2004) pp. 4691-4697.

Janasek, Dirk et al., "Scaling and the Design of Miniaturized Chemical-Analysis Systems," *Nature* 442 (2006) pp. 374-380.

Kim, S. et al., "Characterization of Zein Modified with a Mild Cross-Linking Agent," *Industrial Crops and Products* 20 (2004) pp. 291-300.

Lai, Huey-Min et al., "Properties and Microstructure of Plasticized Zein Films," *Cereal Chem.* 74, 6 (1997) pp. 771-775.

Lawton, John W., "Zein: A History of Processing and Use," *Cereal Chem.* 79, 1 (2002) pp. 1-18.

Paguirigan, A. et al., "Gelatin Based Microfluidic Devices for Cell Culture," *Lab on a Chip*, 6 (2006) pp. 407-413.

Paguirigan, Amy L. et al., "Protocol for the Fabrication of Enzymatically Crosslinked Gelatin Microchannels for Microfluidic Cell Culture," *Nature Protocols* 2, 7 (2007) pp. 1782-1788.

Parris, Nicholas et al., "Composition Factors Affecting the Water Vapor Permeability and Tensile Properties of Hydrophilic Zein Films," *J. Agric. Food Chem.* 45 (1997) pp. 1596-1599.

Powell, David E. et al., "Silicone in the Environment: A Worst-Case Assessment of Poly(dimethylsiloxane) (PDMS) in Sediments," *Environmental Science & Technology* 33, 21 (1999) pp. 3706-3710.

Qin, Dong et al., "Soft Lithography for Micro-and Nanoscale Patterning," *Nature Protocols* 5, 3 (2010) pp. 491-502.

Shi, Ke et al., "Engineering Zein Films with Controlled Surface Morphology and Hydrophilicity," *J. Agric. Food Chem.* 57 (2009) pp. 2186-2192.

Shukla, Rishi et al., "Zein: The Industrial Protein from Corn," *Industrial Crops and Products* 13 (2001) pp. 171-192.

Sidorova, Julia M. et al., "Microfluidic-Assisted Analysis of Replicating DNA Molecules," *Nature Protocols* 4, 6 (2009) pp. 849-861.

Skurtys, O. et al., "Applications of Microfluidic Devices in Food Engineering," *Food Biophysics* 3 (2008) pp. 1-15.

Sozer, Nesli et al., "Nanotechnology and its Applications in the Food Sector," *Trends in Biotechnology* 27, 2 (2009) pp. 82-89.

Sun-Shen, Qing et al., "Comparison of Cytocompatibility of Zein Film with Other Biomaterials and Its Degradability in Vitro," *Biopolymers* 78 (2005) pp. 268-274.

Trezza, Thomas A. et al., "Water Vapor and Oxygen Barrier Properties of Corn Zein Coated Paper," *Tappi Journal* 81, 8 (1998) pp. 171-176.

Tsao, Chia-Wen et al., "Bonding of Thermoplastic Polymer Microfluidics" *Microfluid Nanofluid* 6 (2009) pp. 1-16.

Vozzi, Giovanni et al., "Fabrication of PLGA Scaffolds Using Soft Lithography and Microsyringe Deposition," *Biomaterials* 24 (2003) pp. 2533-2540.

Wang, Hua-Jie et al., "Effect of Water Vapor on the Surface Characteristics and Cell Compatibility of Zein Films," *Biointerfaces* 69 (2009) pp. 109-115.

Whitesides, George M., "The Origins and the Future of Microfluidics," *Nature* 442 (2006) pp. 368-373.

Xia, Younan et al., "Soft Lithography," *Annu. Rev. Mater. Sci.* 28 (1998) pp. 153-184.

Yi, Changqing et al., "Microfluidics Technology for Manipulation and Analysis of Biological Cells," *Analytica Chimica Acta* 560 (2006) pp. 1-23.

\* cited by examiner

US 8,956,577 B2

MICROFLUIDIC DEVICE COMPRISING A BIODEGRADABLE MATERIAL AND METHOD OF MAKING SUCH A MICROFLUIDIC DEVICE

RELATED APPLICATION

The present patent document claims the benefit of the filing date under 35 U.S.C. §119(e) of U.S. Provisional Patent Application Ser. No. 61/498,222, filed on Jun. 17, 2011, which is hereby incorporated by reference in its entirety.

FEDERALLY SPONSORED RESEARCH OR DEVELOPMENT

This invention was made with government support under contract number 2007-35603-17744 awarded by the United States Department of Agriculture. The government has certain rights in the invention.

TECHNICAL FIELD

The present disclosure is related generally to microfluidic devices and more particularly to microfluidic devices comprising biodegradable materials.

BACKGROUND

Zein, a prolamin protein in corn, is a unique biodegradable polymer that is found in abundance in corn gluten meal, a coproduct of corn wet milling. Zein exhibits hydrophobicity and thermoplastic behavior, which allows the natural polymer to be formed into films and coatings. Approved by U.S. Food and Drug Administration as a nontoxic material for food applications, zein is also biocompatible.

Petroleum-based polymer and plastic materials, such as poly(dimethylsiloxane) (PDMS), acrylics and polycarbonate, have been widely used to make mesoscale and microscale fluidic devices. A drawback of such microfluidic platforms is potential environmental pollution, especially when the devices are intended for use in the field for disposable applications.

BRIEF SUMMARY

Described herein are "green" microfluidic devices that may be utilized as disposable environmentally-friendly lab-on-a-chip devices. A method of making such microfluidic devices is also set forth.

According to one embodiment, the microfluidic device comprises a body including one or more channels extending therethrough for passage of a fluid, where the body includes a first preform and a second preform bonded to the first preform. The first preform comprises a biodegradable material derived from a plant and the second preform defines a wall of each of the channels.

According to another embodiment, the microfluidic device comprises a body having one or more channels extending therethrough for passage of a fluid, where the body comprises a biodegradable material and includes no seams. Accordingly, the body is a monolithic body.

A method of making a microfluidic device comprises forming one or more recessed features in a surface of a first preform to create a patterned surface, where the first preform comprises a biodegradable material derived from a plant. An opposing surface of a second preform is provided, and a solvent is applied to at least one of the patterned surface and the opposing surface. After applying the solvent, the patterned surface and the opposing surface are brought into contact, and the patterned surface of the first preform is bonded to the opposing surface of the second preform. Accordingly, a body including one or more channels extending therethrough for passage of a fluid is formed.

BRIEF DESCRIPTION OF THE DRAWINGS

FIG. 3a shows a soft lithography approach to producing a patterned surface on a preform, FIG. 3b illustrates spray deposition of a solvent followed by solvent bonding, FIG. 3c illustrates vapor deposition of a solvent followed by solvent bonding, and FIG. 3d shows macroscale images of zein-glass and zein-zein microfluidic devices and a colorant-filled zein-glass microfluidic device with tubings (inset).

FIG. 5a shows the experimental set-up for evaluating the bonding strength of zein-glass microfluidic devices bonded by solvent bonding after ethanol vapor deposition.

FIG. 5b shows a fractured zein body after the bonding strength test carried out using the experimental set-up of FIG. 5a.

FIG. 7a shows a network of interconnected letters defined by continuous microfluidic channels, FIG. 7b shows a microfluidic network with channels and chambers, and FIG. 7c shows a solved microfluidic maize maze with multiple false paths; blue food dye is used for visual aid and all scale bars are 5 mm.

DETAILED DESCRIPTION

Figure 1:
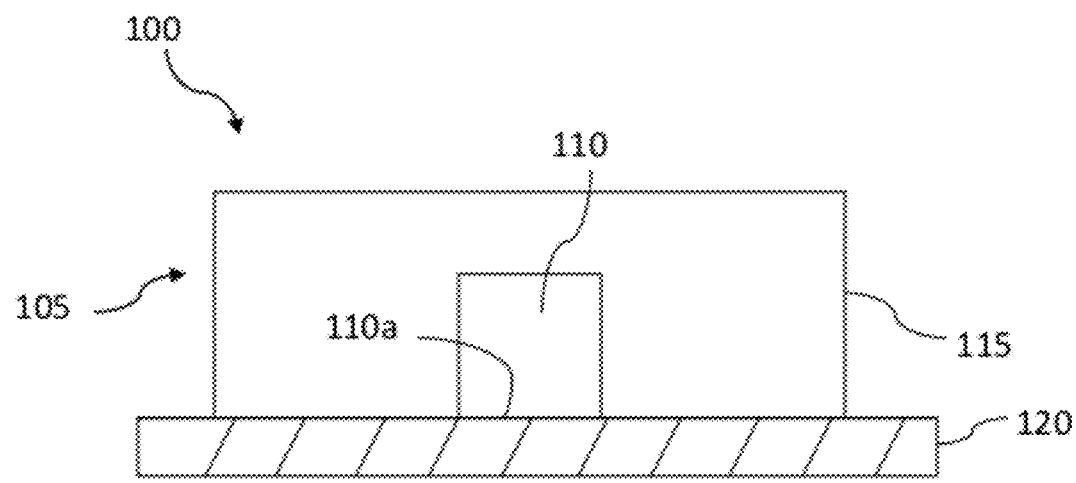
FIG. 1 is a cross-sectional schematic of an exemplary microfluidic device according to a first embodiment.
Figure 2:
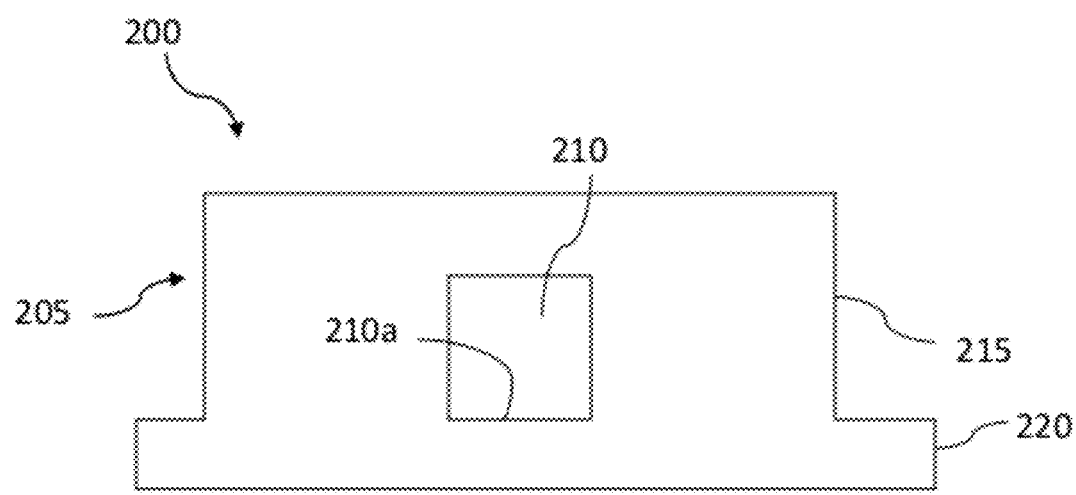
FIG. 2 is a cross-sectional schematic of an exemplary microfluidic device according to a second embodiment.

An exemplary "green" microfluidic device 100, 200 is shown in FIGS. 1 and 2. The microfluidic device 100, 200 includes a body 105, 205 having one or more channels 110, 210 extending therethrough for passage of a fluid. The body 105, 205 comprises a first preform 115, 215 and a second preform 120, 220 bonded to the first preform 115, 215. The first preform 115, 215 comprises a biodegradable material derived from a plant and the second preform 120, 220 defines a wall 110a, 210a of each of the channels 110, 210. The biodegradable material may be zein.

According to the embodiment of FIG. 1, the second preform 120 may comprise a substrate material different from the biodegradable material of the first preform 115. For example, the substrate material may be glass.

According to the embodiment of FIG. 2, the second preform 220 may comprise the same biodegradable material as the first preform 215. For example, the first and the second preforms 215, 220 may comprise zein. Accordingly, the body 205 may be a monolithic body that includes no seam between the second preform 220 and the first preform 215. The phrase "no seam" means that it is not possible to discern, using the microscopy methods discussed in the present disclosure, an interface between the first preform 215 and the second preform 220 that extends entirely across the body 205, which may be several centimeters in length and/or width. Preferably, it is not possible to determine any evidence of an interface between the first preform and the second preform; however, on small length scales, it may be possible to discern a discrete interface (e.g., up to tens or hundreds of microns in length) between the first and second preforms, typically near the channels.

Zein is a natural amorphous polymer that is not only biodegradable (i.e., can be broken down by bacteria or other natural decaying processes), but also hydrophobic and biocompatible. Zein may be separated from corn gluten meal by solvent extraction, usually with isopropanol. The extract may be clarified centrifugally, and then chilled to precipitate the zein. Additional extractions and precipitations can increase the purity of the zein, which may then be dried to a powder. Further information about extracting and processing zein may be found in U.S. Pat. No. 6,849,113, "Method of manufacturing improved corn zein resin films, sheets, and articles," which is hereby incorporated by reference.

Zein may be combined with a plasticizer and processed as a thermoplastic material into a molded shape or film. Accordingly, the body and/or preform may include, in addition to zein, a plasticizer selected from the group consisting of oleic acid, stearic acid, palmitic acid, glycerin, triethylene glycol, glycol monoesters, glyceryl monoesters, acetylated monoglycerides, dibutyl tartrate, lactic acid, and tricresyl phosphate. For example, the plasticizer may be present in an amount of from about 50 wt. % to about 100 wt. %, depending on the desired mechanical properties, where the weight percentage (wt. %) of the plasticizer is given relative to the amount of zein present. For example, a concentration of 100 wt. % plasticizer means there is an equivalent amount of zein and plasticizer present. Other plant-derived biodegradable materials besides zein that may be suitable for the microfluidic device include cellulose-based (paper) materials or plant-derived hydrogel-based materials.

Figures 3A, 3B, 3C, 3D:
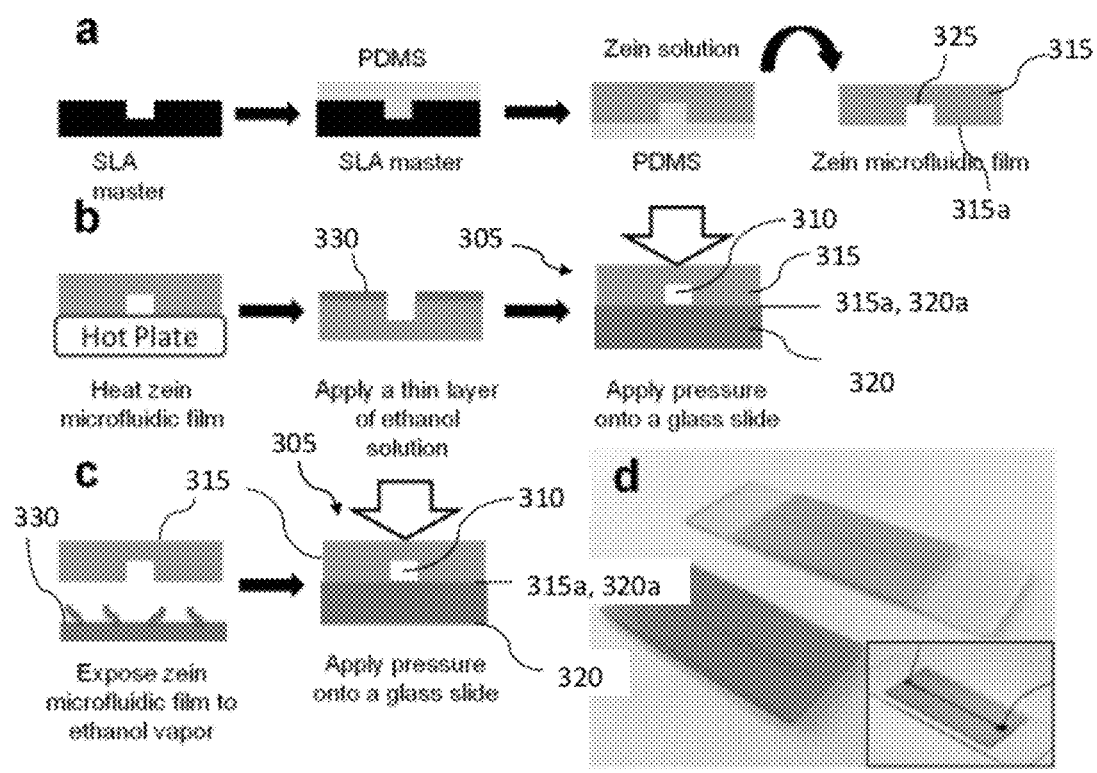
FIGS. 3a-3d show schematically exemplary routes for the fabrication of microfluidic devices, where

The microfluidic device comprising the first and second preforms may be fabricated by a patterning method in conjunction with a solvent bonding technique, as described in reference to FIGS. 3a-3d. First, one or more recessed features 325 may be formed in a surface 315a of the first preform 315 using a patterning method such as soft lithography, as shown schematically in FIG. 3a and discussed in more detail below. The surface 315a of the first preform 315 may thus be referred to as a patterned surface 315a. The second preform 320 comprises an opposing surface 320a, which may be flat or patterned. A solvent 330 is applied to at least one of the patterned surface 315a of the first preform 315 and the opposing surface 320a of the second preform 320. The patterned surface 315a and the opposing surface 320a are then brought into contact and bonded together, as shown in FIGS. 3b and 3c. The opposing surface 320a of the second preform 320 provides a means of covering or enclosing the recessed features 325 of the first preform 315 when the surfaces are brought into contact, and, as a consequence of the bonding step, a body 305 including one or more channels 310 extending therethrough is formed.

The bonding step may comprise forming a monolithic body having a seamless bond between the patterned surface of the first preform and the opposing surface of the second preform. This may be the case when both the first preform and the second preform comprise the same biodegradable material, and further when a solvent bonding method is employed as described below. Alternatively, when the first preform comprises the biodegradable material and the second preform comprises another material, such as glass, a seamless bond may not result from the bonding step.

The channels of the microfluidic device formed as described above typically have an average lateral dimension (e.g., width) of at least about 1 micron, or at least about 10 microns, and the average lateral dimension may also be at least about 100 microns. Typically, the average lateral dimension is no greater than about 1 mm (1,000 microns). For example, the average lateral dimension may range from about 50 microns to about 500 microns, or from about 100 microns to about 400 microns. The channels may have a substantially rectangular lateral cross section, or another cross-sectional geometry, such as trapezoidal.

Referring again to FIG. 2, the microfluidic device 200 includes a body 205 having one or more channels 210 extending therethrough for passage of a fluid. The body 205 comprises a biodegradable material and includes no seams; thus, it may be referred to as a monolithic body. Such a seamless body 205 may have exceptionally good mechanical integrity and resistance to leakage. The biodegradable material may be derived from a plant. For example, the biodegradable material may be zein, which is derived from corn as discussed above.

The "green" microfluidic devices described herein may be used for bioanalytical and diagnostic applications in agriculture, biotechnology, and other fields.

An exemplary method of making the above-described microfluidic devices is set forth in detail below. A preform (or film) with a pattern of recessed features imprinted into its surface that may be employed to form the exemplary microfluidic devices shown in FIGS. 1 and 2 can be prepared using soft lithography. Stereolithography or photolithography may be used to form a pattern master. In the example described here, a WaterClear® Ultra 10122 polymeric master made with stereolithography (SLA) is employed as the pattern master; alternatively, a silicon master created using photolithography may be employed. Referring to FIG. 3a, an intermediate master formed from PDMS and comprising complementary features (or "negative features") is created by casting and replication on the pattern master. The intermediate master may then be used to make a preform having a patterned surface complementary (or "negative") to that of the intermediate master by solvent casting. In this example, the preform is fabricated at the ratio of 1 g of zein:50-100 wt.% of plasticizer:15 wt. % of emulsifier. As above, the weight percentages refer to the amount of each component relative to the amount of zein present.

By using the two-step replication process described above, a zein preform that includes microfluidic features, such as 500-μm wide reservoirs with a depth of 500 μm, may be produced, as shown in the scanning electron microscope (SEM) images of FIGS. 4a-4f. The cross-sectional geometry of the reservoirs may be slightly deviated from the original cross-sectional geometry (in this case rectangular) of the intermediate master; the replica reservoir created in the zein preform appears trapezoidal. Distortion and/or shrinkage of a zein preform during drying after the casting process can be decreased either by casting thinner zein films/preforms (<1 mm) or by using a stiffer formulation of the PDMS intermediate master.

Zein preforms including recessed features such as the reservoir shown in FIG. 3a may then be bonded to glass slides or zein preforms by a suitable bonding method, such as solvent bonding, where the solvent is applied by either spray deposition or vapor deposition (FIGS. 3b and 3c). The resulting zein preforms include channels extending therethrough, and they are typically light yellow in color and substantially transparent, as shown in FIG. 3d. Experiments have shown that a PDMS intermediate master can successfully transfer topographical features into the surface of the zein preform with a high degree of feature fidelity, and thus an accurate negative replica of the PDMS intermediate master may be created.

The solvent bonding process begins with application of an organic solvent to one or both surfaces to be bonded. For example, the patterned surface of a preform comprising a biodegradable material may be thinly coated with aqueous ethanol or another solvent and optionally heated to form a thin solvated layer. During this process, the biodegradable material within the thin solvated layer becomes more mobile and can diffuse across the solvated layer to a mating surface. When both the patterned surface and the opposing surface comprise zein, the organic solvent promotes entanglement of zein polymers across the zein-zein interface, resulting in a seamless bond. In the case of zein-glass interfaces, since glass is a dissimilar material, only the thin solvated zein layer may adhere to the glass substrate (e.g., a glass slide). Use of an excess amount of solvent may cause the geometry of a body comprising biodegradable material to be distorted during the bonding process; this may be avoided by applying a controlled amount of the solvent via a vapor deposition technique, as described further below.

The solvent may be applied to either the patterned surface or the opposing surface, or to both surfaces prior to bonding, as mentioned above. Depending on the deposition method, it may be advantageous to apply the solvent to the patterned surface instead of the opposing surface, or vice versa.

The solvent is selected based on its capacity to dissolve the biodegradable material at the surface of the first and/or second preform. The solvent may comprise an organic solvent. Suitable organic solvents may include one or more of ethanol, isopropanol, and acetic acid. Pure ethanol or an aqueous solution of ethanol may be particularly effective as a solvent for zein; for example, a suitable aqueous solution may include about 75-95 vol. % ethanol. The solvent may be applied by any of a variety of deposition methods, including, for example, spray coating or vapor deposition. Vapor deposition may entail exposing the patterned surface and/or the opposing surface to a solvent vapor produced by heating the solvent to a temperature at or above its boiling point. In the case of an aqueous solution of ethanol, for example, the heating may take place at a temperature of about 65° C. or higher. After several minutes (e.g., 3-7 min) of exposure to the solvent vapor, the exposed surface(s) may include a coating of the solvent deposited by condensation.

After the solvent is applied, the patterned surface may be brought into contact with the opposing surface and bonded thereto. The bonding may be carried out at room temperature or at a temperature slightly above room temperature, such as 30-35° C. A low pressure may be employed during bonding. For example, the two surfaces may be held together with hand pressure, and/or a weight of 300-700 grams may be applied. Advantageously, due to the use of a solvent during bonding, an adhesive is not required and a seamless bond may be obtained.

The opposing surface that is bonded to the patterned surface may be a substantially flat surface. Alternatively, the opposing surface may include one or more recessed features, similar to the patterned surface. The opposing surface may include, for example, a pattern complementary to that of the patterned surface.

When a zein preform or film is bonded to a glass slide by a solvent bonding method, there are two distinct layers observed from scanning electron microscope (SEM) imaging: the bulk zein film and the glass slide. Based on SEM images (e.g., FIG. 4c) of the preform cross section, the bulk zein film contains smooth layers of zein protein and it contains no observable defects, such as cracks or discontinuities, and the bonded zein layer cannot be distinguished from the bulk zein film optically. There is no observable gap between the glass and the zein, which shows the strong bonding achieved between the zein preform and the glass slide.

Figures 4A, 4B, 4C, 4D, 4E, 4F:
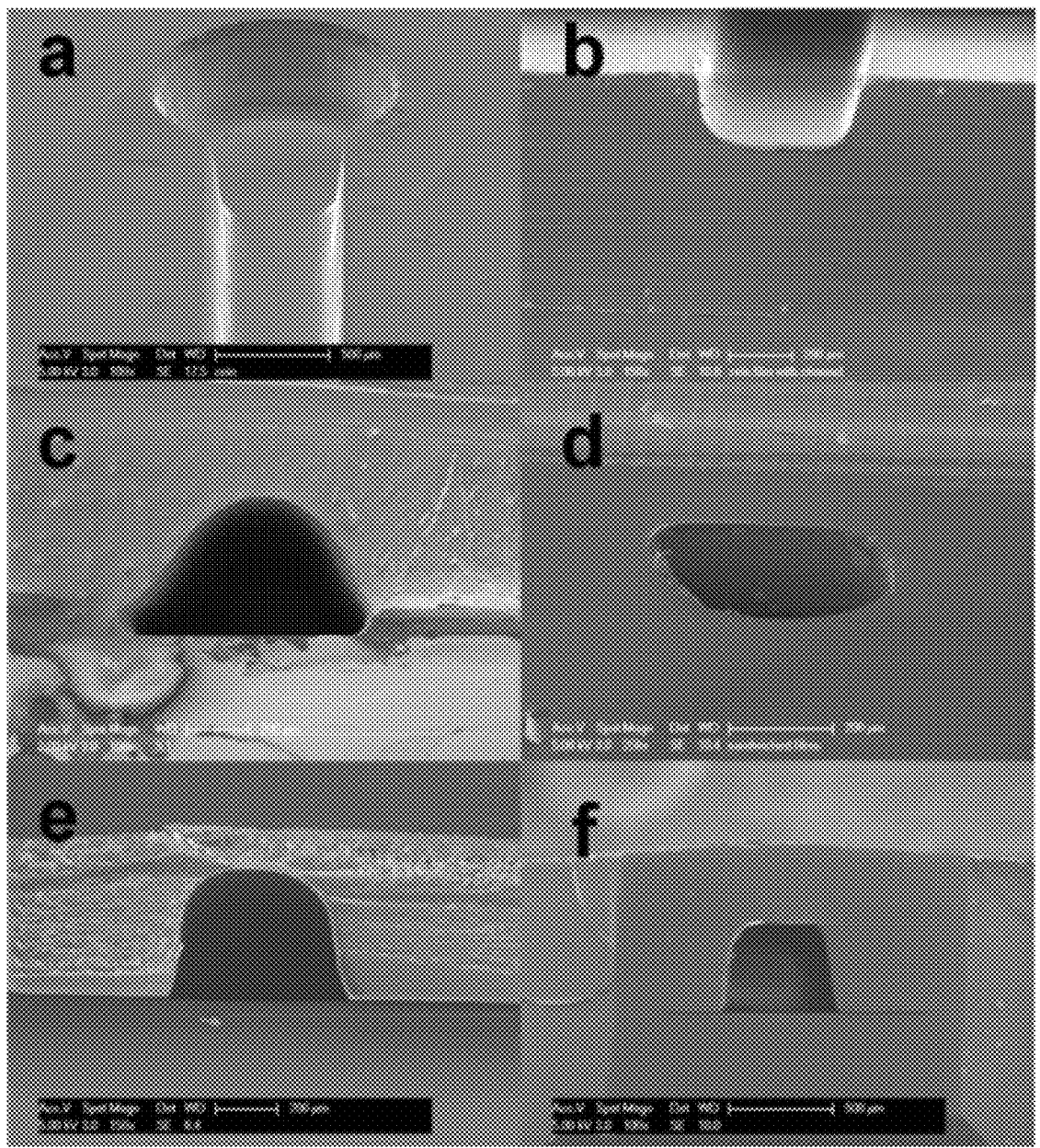
FIGS. 4a-4b show scanning electron microscope (SEM) images of microfluidic devices comprising zein, which show that zein preforms can accurately replicate features from a master by soft lithography, such as a 500-microns-wide channel (FIG. 4a) and a 1 mm chamber (FIG. 4b).
FIGS. 4c-4d show cross-sectional SEM images of zein-glass and zein-zein microfluidic devices, respectively, bonded by solvent bonding after spray deposition of the solvent.
FIGS. 4e-4f show zein-glass and zein-zein (f) microfluidic devices bonded by solvent bonding after vapor deposition of the solvent.

Similarly, there is no observable seam in the zein body formed using the solvent bonding technique described above, as shown by the SEM image of FIG. 4d. The width of the channel in the zein-zein microfluidic device measures approximately 435 micrometers and the height of the channel is approximately 200 micrometers (although the height measurement may be slightly off due to the viewing angle of the image). Also, the micro-channel geometry after bonding in the zein-zein microfluidic device is more oval-shaped compared to the geometry on the zein-glass microfluidic device. Applying excessive solvent to the surface of the zein preform may lead to distortion at the zein-zein interface and/or channel collapse as the solvated zein flows into the adjacent channel, as indicated above. To avoid distortion, a controlled amount of solvent may be applied to one or both of the surfaces to be bonded. A particularly good method for applying an appropriate amount of solvent and creating a zein-zein, zein-glass, or zein-other material bond is vapor deposition. It is observed by SEM that zein bodies formed by vapor deposition and solvent bonding may maintain the original shape of the recessed features very well in both zein-glass and zein-zein samples (FIGS. 4e and 4f). Vapor deposition combined with solvent bonding can provide a composition including zein bonded to either a glass slide or another zein preform with less zein debris at the interface and minimal channel distortion in comparison to samples bonded after spray deposition. Channel distortion may be further reduced by adjusting the applied pressure during the bonding process and by employing a thicker zein preform. Another advantage of vapor deposition over spray deposition of the solvent is that the inlet and outlet of a zein preform may be punctured before bonding without having solvated zein flow inside the channel.

Figures 5A, 5B:
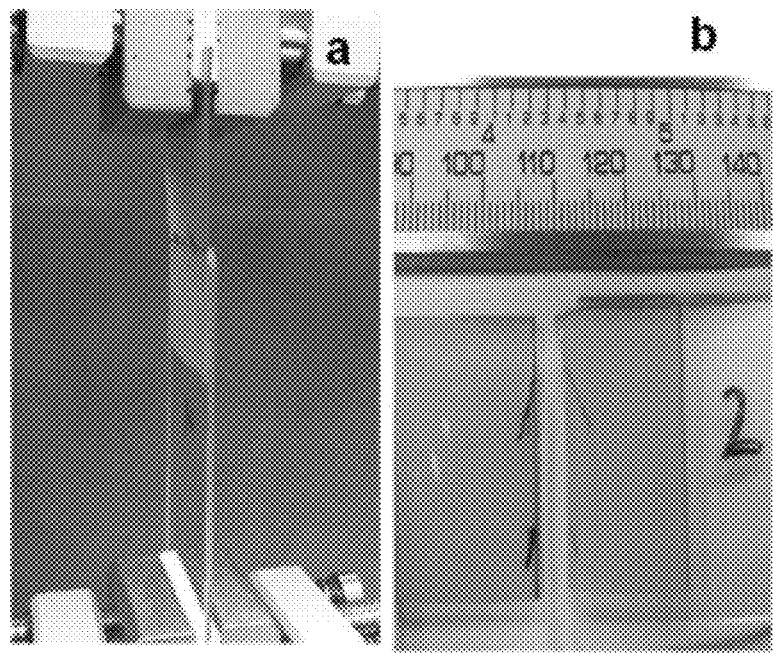

The strength of the bond between the zein film and the glass slide may be measured using a pull or stretch test (FIGS. 5a and 5b). Interestingly, the strength of the bond is observed to be greater than the tensile strength of the zein film, as the un-bonded portion of the zein film is torn apart while the zein-glass interface, which includes the bonded portion of the zein film, remains undistorted during the test. The tensile strength of zein films varies from 2 to 4 MPa. During the stretching test, film necking is observed near the zein-glass interface. Post-stretching observations reveal that zein film breakage occurs near the zein-glass interface and the break line of the film is straight, which is likely due to uniform bonding across the attached area. The bonded portion of the zein film shows no translation with respect to the glass slide.

Figures 6A, 6B, 6C, 6D:
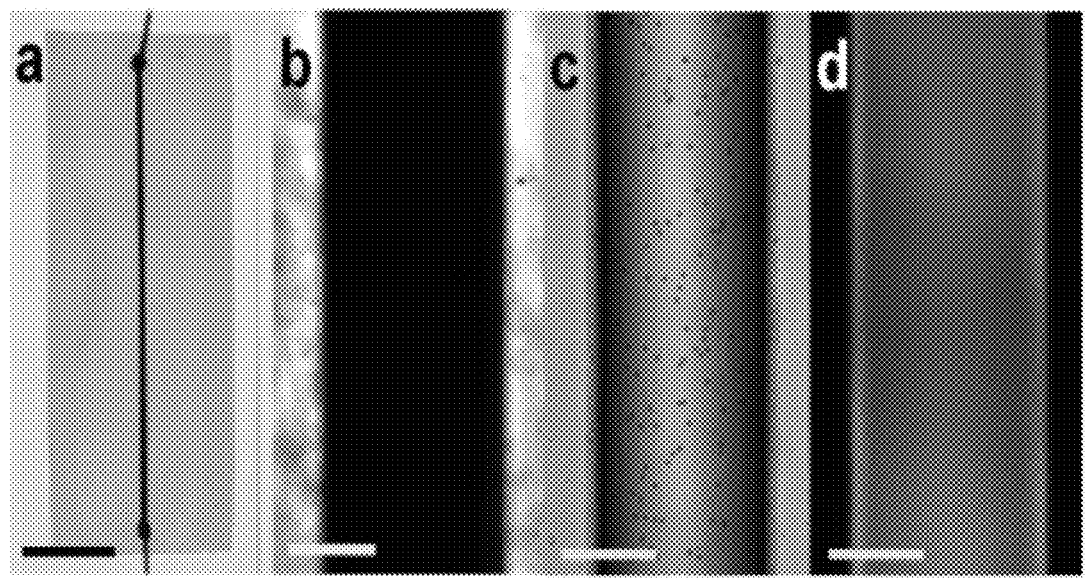
FIG. 6a shows a macroscale photographic image of crystal violet stain fluid flows in a zein-glass microfluidic device with tubing at the inlet and outlet ports (scale bar: 10 mm).
FIG. 6b shows a microscale image of blue food coloring inside the zein-glass device to illustrate the strength of channel bonding (and lack of leakage) (scale bar: 250 µm).
FIG. 6c shows 10 µm microspheres inside the zein-glass device to show good visibility of the device (scale bar: 250 µm).
FIG. 6d shows Rhodamine B stain inside the zein-glass device to illustrate the low auto-fluorescent level of zein in contrast with Rhodamine B (scale bar: 250 µm).

Several types of fluid were flowed through zein-glass microfluidic devices that were solvent bonded after vapor deposition of ethanol. FIGS. 6a-6d show visualization of colorant, microparticles, and fluorescent molecules in the exemplary zein-glass devices. A crystal violet stain solution was observed to flow only inside the zein-glass microfluidic channel and did not leak out at any point along the length of the device, which included tubing at the inlet and outlet ports (FIG. 6a). Microscope images of the microfluidic channel revealed the presence of the blue food dye inside the channel, and, due to the complete encapsulation of the dye solution, the boundary between the microfluidic channel and the walls is clearly defined (FIG. 6b). FIG. 6c shows the solution containing 10-micron-diameter microbeads flowing through the zein-glass microfluidic devices prepared by solvent bonding after vapor deposition of ethanol. The flow of the microbeads can be clearly seen through the glass side of the zein-glass microfluidic device. Zein, like other biomaterials, has an auto-fluorescent property. However, the auto-fluorescent level of zein is much lower than the fluorescent signal of fluorescent dyes such as Rhodamine B (FIG. 6d).

Figures 7A, 7B, 7C:
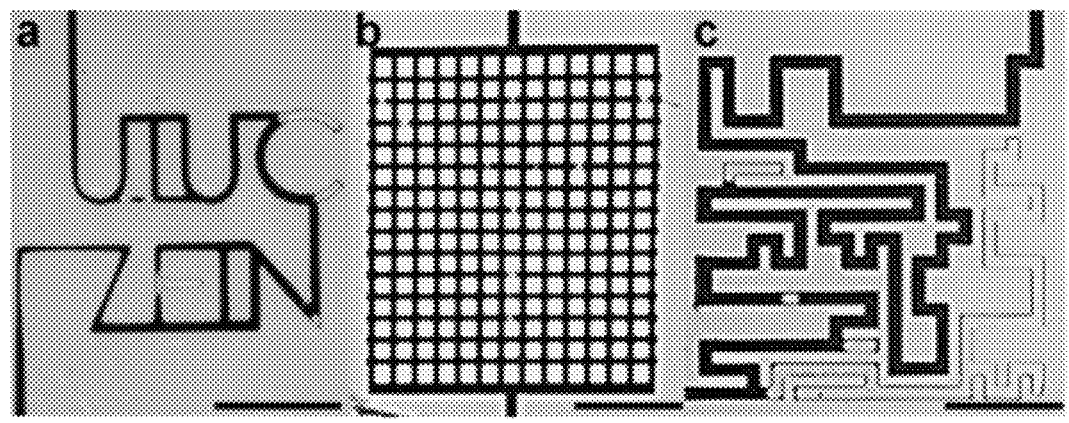
FIGS. 7a-7c show visualization of zein microfluidic devices with complex fluidic pathways, where

Referring to FIGS. 7a-7c, zein microfluidic devices with complex fluidic pathways have been fabricated. A food colorant was successfully flowed through an interconnected letter channel (FIG. 7a), a microfluidic network with channels and chambers (FIG. 7b), and a solved microfluidic "maize" maze with multiple false paths (FIG. 7c). A complete confinement of the food colorant through the entire length of the microfluidic channels demonstrates the quality and integrity of the bonded zein-glass interface over a large surface area (>100 mm$^2$) and also the resistance of the microfluidic channels to hydraulic pressure.

Figures 8A, 8B, 8C:
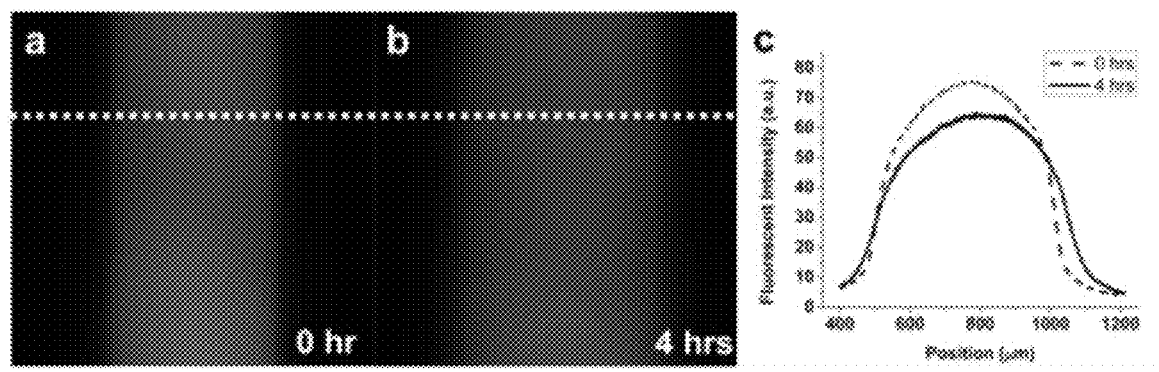
FIGS. 8a-8b show characterization of Rhodamine B absorption into a zein-zein microfluidic device filled with Rhodamine B solution at a concentration of 0.1 mM, where the fluorescent profile was taken over time along the white dotted line at time=0 hour (FIG. 8a) and at time=4 hours (FIG. 8b).
FIG. 8c shows the fluorescent profile of Rhodamine B at time=0 hour (dashed line) and time=4 hours (solid line) across the channel.

A distinctive property of the zein-based microfluidics devices is the controllable material permeability to aqueous solutions, which may enable new applications. The water impermeability of both zein-zein and zein-glass devices can be characterized by static imaging of the absorption of Rhodamine B solution. After an exemplary channel was filled with Rhodamine B solution, it was imaged at 1-hour intervals for four hours and the fluorescent intensity profile was obtained over the cross-section of the channel (FIGS. 8a-8c). The diffusion coefficient of Rhodamine B in the zein composition can be calculated by fitting the fluorescent intensity profile to Fick's second law of diffusion.

The mean value of the diffusion coefficient for zein-zein microfluidic devices and zein-glass microfluidic devices is $0.79 \times 10^{-12}$ m$^2$/s and $0.17 \times 10^{-12}$ m$^2$/s, respectively. Preferably, oleic acid is selected as the plasticizer at the concentrations provided above, given its advantageous impact on the mechanical properties and water impermeability of the zein-based microfluidic device. Accordingly, microfluidic devices prepared according to the present disclosure may comprise a body having a diffusion coefficient of less than $1 \times 10^{-12}$ m$^2$/s (e.g., about $0.8 \times 10^{-12}$ m$^2$/s or lower, alternatively about $0.5 \times 10^{-12}$ m$^2$/s or lower, or about $0.2 \times 10^{-12}$ m$^2$/s or lower). The diffusion coefficient is also generally about $1 \times 10^{-13}$ m$^2$/s or greater; for example, the diffusion coefficient may range from about $1 \times 10^{-13}$ in$^2$/S to less than $1 \times 10^{-12}$ m$^2$/s. For comparison, the diffusion coefficents of other biodegradable materials are $10^{-12}$ m$^2$/s for polydextrose, $10^{-10}$ m$^2$/s for starch, and $10^{-10}$ in$^2$/S to $10^{-8}$ m$^2$/s for wheat.

As described herein, a preform comprising a biodegradable material such as zein can be bonded easily and quickly to different kinds of materials without requiring expensive equipment, such as an oxygen plasma generator. The application of microfluidic devices based on zein can be far reaching due to its biocompatibility, biodegradability and renewability. The immediate future applications of zein microfluidic devices may include cell culturing, encapsulation of biomolecules, and toxin screening through selective gas and water permeability.

Experimental Details (1) Preparation of Stereolithography and Soft Lithography Masters Positive SLA masters of WaterClear® Ultra 10122 (DSM Somos®, Elgin, Ill.) microfluidic channels (500 um×500 um) were fabricated using a three-dimensional printing system (3D Systems, S.C., USA) at a 16-micron z-axis resolution mode. PDMS polymer (Sylgard® 184 Silicone elastomer base, Dow Corning Corp., Mich.) was prepared at the ratio of polymer to curing agent (Sylgard® 184 Silicone elastomer curing agent, Dow Corning Corp., Mich.) of 10:1 (w/w). The PDMS solution was placed still at ambient condition for 12 hours to degas. After degassing, the PDMS solution was poured onto the SLA master and cured at 70° C. for 1 hour.

(2) Fabrication of Zein Microfluidic Films Using Soft Lithography

Zein (4% moisture content and 90% protein) with 100 wt. % oleic acid (Sigma Aldrich, Milwaukee, Wis.) and 5 wt. % monoglyceride (Caravan Ingredients, Lenexa, Kans.) were dissolved in warm (50° C.) aqueous ethanol (75% v/v) (zein 6 g: ethanol 30 ml). Then the mixture was heated at 65-70° C. for 5 minutes before being sonicated in order to remove air bubbles. After that, the mixture was poured on top of the PDMS master with designed microchannels and dried in a desiccator for 72 hours. The patterned zein films were obtained by peeling off the PDMS master. The thickness of zein film was set by controlling the volume of the zein solution during casting step.

(3) Zein Microfluidic Film Bonding Process Using Solvent and Vapor Deposition Methods A degreased glass slide and a zein film with microfluidic channel were placed patterned-side down on hot plate with set temperature at 35° C. for 5 minutes. A thin layer of aqueous ethanol (75%) was sprayed on an extra glass slide and the patterned surface of zein film was placed on the ethanol-coated surface of the extra glass slide to transfer a thin film of ethanol. The ethanol-coated zein film was attached to the warmed surface of the glass slide and initially pressed by hands to ensure the zein film was fully in contact with the glass slide. A light weight (500 grams) was placed on top of the bonded zein film-and kept at 35° C. for five more minutes. The bonded zein-glass microfluidic device was cooled down to ambient temperature before use.

For the vapor deposition bonding process, 95% v/v ethanol solution was heated to 65° C. in a 500 mL beaker and a zein film with microfluidic channel was exposed to the ethanol vapor for 5 minutes. The ethanol-exposed zein film was attached to a degreased glass slide and initially, pressed down by hand to ensure the zein film was fully in contact with the glass slide. A light weight (500 grams) was placed on top of the bonded zein film for five minutes at room temperature. For zein-zein devices, the same bonding procedure was followed.

(4) Scanning Electron Microscope (SEM) Imaging

An electron microscope (FEI Company, Hillsboro, Oreg.) was used to visualize the cross-sectional area of the zein microfluidic devices. The zein microfluidic devices were sputter-coated with 7 nm of Au/Pd for imaging contact. The cross sectional area of zein-zein sample was obtained by first cutting the zein chip into pyramid shape with razor blade and smoothing the cross sectional area with diamond knife of microtome. The zein-glass sample was cross sectioning by cutting the zein piece with razor blade and scoring then snapping the glass piece.

(5) Bond Strength Testing

A mechanical shear stress test using Texture Analyzer HD Plus (Stable Micro Systems, Surrey, UK) was used to test the bonding strength of zein film (preform) attached to a glass slide. Three zein preforms prepared from the same formulation and method, with thicknesses of 0.46 mm±0.04 mm, were cut into size of 22×26 mm$^2$. Each zein film was bonded onto a glass slide by the method described above with a bonding area of 16×22 mm$^2$. The glass slide end, fixed to a C-clamp, was stationary while the zein film end was pulled upward at a velocity of 0.1 mm/s. A double-sized tape was used to increase the adhesion and cushion between the samples and the clamp to avoid breakage and tear. The textural analyzer was calibrated prior to the mechanical test with a 30-gram load cell and the resulting stress and strain was calculated using the built-in software.

(6) Optical Characterization of Microfluidic Channels

Inlet and outlet openings in the bonded zein microfluidic channels were punctured using 20 gauge stainless steel blunt needles. For zein-glass microfluidic chip bonded by vapor deposition bonding method, the fluids were manually introduced into the microfluidic channel using a 5 mL syringe. The crystal violet stain and food dye were used without dilution. The solution of microsphere contained approximately 70,000 of 10-micron beads/ml. Once the solution exited from the outlet opening, the microfluidic channels were imaged immediately to minimize any evaporation effect. Optical visualization of the fluid containing microfluidic channels on the zein microfluidic chips was achieved using an inverted microscope (Olympus IX81, Pennsylvania, USA) with 4× and 10× objectives using with bright field illumination. The images were taken using a 2 MP camera (Diagnostic Instruments, Mich., USA) with <50 millisecond exposures.

(7) Zein Fluorescent and Diffusion Characterization Using Rhodamine B 0.1 mM Rhodamine B solution (Vendor) was introduced into the zein microfluidic channel using a 5 mL syringe. Fluorescent images were obtained using an epi-illumination fluorescent microscope (Nikon) with excitation wavelength peak at 541 nm and emission cut-off wavelength at 572 nm. All fluorescent images were taken using the same illumination intensity and exposure time. For diffusion characterization, the fluorescent intensity of Rhodamine B in the zein microfluidic channel (n=3) was recorded hourly for four hours. The resulting spatial distribution of fluorescent intensity was fitted to Fick's second law of diffusion in one dimension to determine the diffusion coefficient.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A microfluidic device comprising:
a body including one or more channels extending therethrough for passage of a fluid, the body comprising:
a first preform and a second preform bonded to the first preform, wherein the first preform comprises a biodegradable material derived from a plant, the biodegradable material comprising zein, and wherein the second preform defines a wall of each of the channels.

2. The microfluidic device of claim 1, wherein the second preform comprises the biodegradable material derived from a plant.

3. The microfluidic device of claim 2, wherein the body is a monolithic body including no seam between the first preform and the second preform.

4. The microfluidic device of claim 1, wherein the second preform comprises a substrate material different from the biodegradable material derived from a plant.

5. The microfluidic device of claim 4, wherein the substrate material is glass.

6. The microfluidic device of claim 1, wherein the preform further comprises a plasticizer mixed with the biodegradable material derived from a plant, the plasticizer being selected from the group consisting of oleic acid, stearic acid, palmitic acid, glycerin, triethylene glycol, glycol monoesters, glyceryl monoesters, acetylated monoglycerides, dibutyl tartrate, lactic acid, and tricresyl phosphate.

7. The microfluidic device of claim 6, wherein the plasticizer is present in an amount of from about 50 wt. % to about 100 wt. % relative to the amount of the biodegradable material present.

8. A microfluidic device comprising:
a body having one or more channels extending therethrough for passage of a fluid, the body comprising a biodegradable material and including no seams, wherein the body is a monolithic body and the biodegradable material comprises zein.

9. The microfluidic device of claim 8, wherein the channels are microchannels having an average lateral dimension of from about 100 microns to about 400 microns.

10. A method of making a microfluidic device, the method comprising:
forming one or more recessed features in a surface of a first preform comprising a biodegradable material to create a patterned surface of the first preform;
providing an opposing surface of a second preform;
applying a solvent comprising ethanol to at least one of the patterned surface and the opposing surface;
after the applying, bringing the patterned surface and the opposing surface into contact; and
bonding the patterned surface of the first preform to the opposing surface of the second preform without employing an adhesive, thereby forming a body including one or more channels extending therethrough for passage of a fluid.

11. The method of claim 10, wherein the biodegradable material is derived from a plant.

12. The method of claim 10, wherein the second preform comprises the biodegradable material.

13. The method of claim 12, wherein the bonding comprises forming a monolithic body having a seamless bond between the patterned surface and the opposing surface.

14. The method of claim 10, wherein the second preform comprises glass.

15. The method of claim 10, wherein applying the solvent comprises exposing at least one of the patterned surface and the opposing surface to a vapor comprising the solvent.

16. A method of making a microfluidic device, the method comprising:
- forming one or more recessed features in a surface of a first preform comprising a biodegradable material derived from a plant to create a patterned surface of the first preform, the biodegradable material being zein;
- providing an opposing surface of a second preform;
- applying a solvent to at least one of the patterned surface and the opposing surface;
- after the applying, bringing the patterned surface and the opposing surface into contact; and
- bonding the patterned surface of the first preform to the opposing surface of the second preform, thereby forming a body including one or more channels extending therethrough for passage of a fluid.

* * * * *